(12) United States Patent
Yamazaki et al.

(10) Patent No.: US 6,914,642 B2
(45) Date of Patent: Jul. 5, 2005

(54) ACTIVE MATRIX DISPLAY DEVICE

(75) Inventors: Sunpei Yamazaki, Tokyo (JP); Jun Koyama, Kanagawa (JP); Yasuhiko Takemura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/170,482

(22) Filed: Jun. 12, 2002

(65) Prior Publication Data

US 2002/0149711 A1 Oct. 17, 2002

Related U.S. Application Data

(60) Continuation of application No. 08/978,210, filed on Nov. 25, 1997, now Pat. No. 6,417,896, which is a division of application No. 08/602,017, filed on Feb. 15, 1996, now Pat. No. 5,729,308.

(30) Foreign Application Priority Data

Feb. 15, 1995 (JP) ............................................. 7-50526
May 30, 1995 (JP) ............................................. 7-155274
Jul. 31, 1995 (JP) ............................................. 7-215408

(51) Int. Cl.[7] ....................... G02F 1/1343; G02F 1/136
(52) U.S. Cl. .......................................... 349/39; 349/43
(58) Field of Search ...................... 349/38–39, 41–42, 349/43; 257/59, 72

(56) References Cited

U.S. PATENT DOCUMENTS

| 4,368,523 A | * | 1/1983 | Kawate ........................ 359/59 |
| 4,623,908 A | | 11/1986 | Oshima et al. ................ 257/66 |
| 4,938,565 A | * | 7/1990 | Ichikawa ...................... 359/59 |
| 5,132,820 A | | 7/1992 | Someya et al. ................ 349/42 |
| 5,182,620 A | | 1/1993 | Shimada et al. .............. 349/72 |

(Continued)

FOREIGN PATENT DOCUMENTS

| DE | 69510826 | | 11/1999 | |
| EP | 0 302 468 | | 2/1989 | |
| EP | 430-592 | * | 6/1991 | .................. 359/59 |

(Continued)

OTHER PUBLICATIONS

Hayashi, et al., "Fabrication of Low–Temperature Bottom–Gate Poly–Si TFTs on Large–Area Substrate by Linear–Beam Excimer Laser Crystallization and Ion Doping Method", LCD Department, Kanagawa, Japan, pp. 829–830, IEEE, 1995.
Complete English Translation of European Office Action (Application No. 196 05 634.9–51), Nov. 23, 2004, 3 pages.
Complete English Translation of European Office Action (Application No. 196 05 670.5–51), Nov. 24, 2004, 4 pages.

Primary Examiner—Dung T. Nguyen
(74) Attorney, Agent, or Firm—Fish & Richardson P.C.

(57) ABSTRACT

In an active matrix display device, a circuit including at least five thin film transistors (TFTs) which are provided with an approximately M-shaped semiconductor region for a single pixel electrode and gate lines and a capacitances line which cross the M-shaped semiconductor region, is used as a switching element. Each of the TFT have offset regions and lightly doped drain (LDD) regions. Then, by supplying a selection signal to the gate lines, the TFTs are operated, thereby writing data to the pixel, while a suitable voltage is supplied to the capacitance line, a channel is formed thereunder and it becomes a capacitor. Thus the amount of discharge from the pixel electrode is reduced by the capacitor.

14 Claims, 14 Drawing Sheets

U.S. PATENT DOCUMENTS

| | | | |
|---|---|---|---|
| 5,218,464 A | * 6/1993 | Hiroki et al. | 359/59 |
| 5,303,072 A | * 4/1994 | Takeda et al. | 359/59 |
| 5,373,377 A | * 12/1994 | Ogawa et al. | 359/59 |
| 5,399,889 A | 3/1995 | Miyake et al. | 257/292 |
| 5,412,493 A | * 5/1995 | Kunii et al. | 349/43 |
| 5,506,598 A | 4/1996 | Shimada et al. | 345/92 |
| 5,515,187 A | 5/1996 | Nakamura et al. | 349/42 |
| 5,528,396 A | 6/1996 | Someya et al. | 349/42 |
| 5,535,028 A | 7/1996 | Bae et al. | 349/145 |
| 5,561,075 A | 10/1996 | Nakazawa | 438/30 |
| 5,583,366 A | 12/1996 | Nakazawa | 257/66 |
| 5,642,213 A | 6/1997 | Mase et al. | 349/43 |
| 5,650,636 A | * 7/1997 | Takemura et al. | 257/59 |
| 5,712,495 A | 1/1998 | Suzawa | 257/51 |
| 5,729,308 A | * 3/1998 | Yamazaki et al. | 349/39 |
| 5,763,899 A | * 6/1998 | Yamazaki et al. | 257/59 |
| 5,767,930 A | * 6/1998 | Kobayashi et al. | 349/42 |
| 5,814,539 A | 9/1998 | Nakazawa | 438/163 |
| 5,856,689 A | 1/1999 | Suzawa | 257/296 |
| 5,879,977 A | 3/1999 | Zhang et al. | 438/166 |
| 5,917,210 A | 6/1999 | Huang et al. | 257/292 |
| 5,929,464 A | * 7/1999 | Yamazaki et al. | 257/72 |
| 6,023,074 A | 2/2000 | Zhang | 349/43 |
| 6,136,625 A | 10/2000 | Nakazawa | 438/30 |
| 6,259,117 B1 | 7/2001 | Takemura et al. | 257/59 |
| 6,297,518 B1 | 10/2001 | Zhang | 257/59 |
| 6,417,896 B1 | * 7/2002 | Yamazaki et al. | 349/39 |
| 6,495,858 B1 | 12/2002 | Zhang | 257/59 |

FOREIGN PATENT DOCUMENTS

| | | | | |
|---|---|---|---|---|
| EP | 450941 | 10/1991 | | |
| EP | 513590 | 11/1992 | | |
| EP | 552 952 | 7/1993 | | |
| EP | 589-478 | * 3/1994 | | 359/59 |
| JP | 62-092370 | 4/1987 | | |
| JP | 63-151083 | 6/1988 | | |
| JP | 3-71185 | 3/1991 | | |
| JP | 03-288824 | 12/1991 | | |
| JP | 5-44195 | 7/1993 | | |
| JP | 5-44196 | 7/1993 | | |
| JP | 05-166837 | 7/1993 | | |
| JP | 5-216065 | * 8/1993 | | 359/59 |
| JP | 5-26766 | 10/1993 | | |
| JP | 5-267667 | 10/1993 | | |
| JP | 5-307189 | * 11/1993 | | 359/59 |
| JP | 6-27484 | * 2/1994 | | 359/59 |
| JP | 6-82757 | * 3/1994 | | 359/59 |
| JP | 6-102531 | 4/1994 | | |
| JP | 06-216386 | 8/1994 | | |
| JP | 6-244104 | 9/1994 | | |
| JP | 06-333948 | 12/1994 | | |
| JP | 7-333653 | 12/1995 | | |
| JP | 8-201852 | 8/1996 | | |
| KR | 96-0001847 | 1/1996 | | |
| TW | 270195 | 2/1996 | | |
| WO | WO96-22616 | 7/1996 | | |

* cited by examiner

ACTIVE MATRIX DISPLAY DEVICE

CROSS-REFERENCE TO RELATED APPLICATIONS

This application is a continuation of U.S. application Ser. No. 08/978,210, filed Nov. 25, 1997 now U.S. Pat. No. 6,417,896, which is a divisional of U.S. application Ser. No. 08/602,017 filed Feb. 15, 1996 now U.S. Pat. No. 5,729,308.

BACKGROUND OF THE INVENTION

1. Field of the Invention

The present invention relates to circuits and elements for improving the image quality of the display screen of an active matrix type display device used in, for example, a liquid crystal display device, a plasma display device or an EL (electroluminescence) display device.

2. Description of the Related Art

FIG. 2A schematically shows a conventional active matrix display device. A region 104 shown by the broken line is a display region. Thin film transistors (TFTs) 101 are arranged at a matrix form in the region 104. The wiring connected to the source electrode of the TFT 101 is an image (data) signal line 106, and the wiring connected to the gate electrode of the TFT 101 is a gate (selection) signal line 105. A plurality of gate signal lines and image signal lines are arranged approximately perpendicular to each other.

An auxiliary capacitor 102 is used to support the capacitance of the pixel cell 103 and store image data. The TFT 101 is used to switch the image data corresponding to the voltage applied to the pixel cell 103.

In general, if a reverse bias voltage is applied to the gate of a TFT, a phenomenon is known that a current does not flow between the source and the drain (the OFF state), but a leak current (the OFF current) flows. This leak current varies the voltage (potential) of the pixel cell.

In an N-channel type TFT, when the gate is negatively biased, a PN junction is formed between a P-type layer which produces at the surface of the semiconductor thin film and an N-type layer of the source region and the drain region. However, since there are a large number of traps present within the semiconductor film, this PN junction is imperfect and a junction leak current is liable to flow. The fact that the OFF current increases as the gate electrode is negatively biased is because the carrier density in the P-type layer formed in the surface of the semiconductor film increases and the width of the energy barrier at the PN junction becomes narrower, thereby leading to a concentration of the electric field and an increase in the junction leak current.

The OFF current generated in this way depends greatly on the source/drain voltage. For example, it is known that the OFF current increases rapidly as the voltage applied between the source and the drain of the TFT increases. That is, for a case wherein a voltage of 5 V is applied between the source and the drain, and one wherein a voltage of 10 V is applied therebetween, the OFF current in the latter is not twice that of the former, but can be 10 times or even 100 times as large. This nonlinearity also depends on the gate voltage. If the reverse bias value of the gate electrode is large (a large negative voltage for an N-channel type), there is a significant difference between both cases.

To overcome this problem, a method (a multigate method) for connecting TFTs in series has been proposed, as in Japanese Patent Kokoku (examined) Nos. 5-44195 and 5-44196. This aims to reduce the OFF current of each TFT by reducing the voltage applied to the source/drain of each TFT. When two TFTs 111 and 112 are connected in series in FIG. 2B, the voltage applied to the source/drain of each TFT is halved. According to the above, if the voltage applied to the source/drain is halved, the OFF current is reduced to $\frac{1}{10}$ or even $\frac{1}{100}$. In FIG. 2B, numeral 113 is an auxiliary capacitor, numeral 114 is a pixel cell, numeral 115 is a gate signal line, and numeral 116 is an image signal line.

However, as the properties required for the image display of a liquid crystal display device become more severe, it becomes difficult to reduce the OFF current sufficiently even using the above multigate method. This is because, even if the number of gate electrodes (the number of TFTs) is increased to 3, 4 or 5, the voltage applied to the source/drain of each TFT is only slightly reduced, to $\frac{1}{3}$, $\frac{1}{4}$ or 1.5. There are additional problems in that the circuit becomes complicated and the occupied area is large.

SUMMARY OF THE INVENTION

The object of the present invention is to provide a pixel circuit having a structure wherein the OFF current is reduced by decreasing the voltages applied to the source/drain of TFTs connected to the pixel electrode to less than $\frac{1}{10}$, preferably less than $\frac{1}{100}$ of their normal value.

The present invention disclosed in the specification is characterized in that a structure includes gate signal lines and image signal lines arranged at a matrix form, pixel electrodes arranged in regions surrounded by the gate signal lines and the image signal lines, and thin film transistors (TFTs) (the number of TFTs is n) having the same conductivity type connected to each other in serial adjacent to each of the pixel electrodes, wherein a source region or a drain region of a first TFT (n=1) is connected to one of the image signal lines, a source region or a drain region of an nth TFT is connected to one of the pixel electrodes, at least one of two regions adjacent to a channel forming region of each of TFTs (the number of TFTs is n−m (n>m)) is a low concentration impurity region that an impurity concentration for providing a conductivity type is lower than the source or drain region, and a gate voltage each of TFTs (The number of TFTs is m) is maintained to a voltage that a channel forming region becomes the same conductivity type as that of the source and drain regions. In the above-structure, n and m are a natural number except 0. To obtain a desired effect, it is preferred that n is 5 or more.

An example of the above structure is shown in FIG. 2C. In FIG. 2C, five TFTs 121 to 125 are each arranged in series, that is, n=5 and m=2. The source region of the TFT 121 (n=1) is connected to an image signal line 129. The drain region of nth TFTs 123 (n=5) is connected to the pixel electrode of a pixel cell 127 and an auxiliary capacitor 126.

Gate electrodes of TFTs 121 to 123 (the number of TFTs is n−m (n>m) are connected to a common gate signal line 123 and each TFT has an LDD (lightly doped drain) structure and/or an offset structure. Gate electrodes of the other TFTs 124 and 125 (the number of TFTs is m) are connected to a common capacitance line 130. The capacitance line 130 is maintained at a desired voltage.

In FIG. 2C, the basic feature of the present invention is to connect the TFTs 121 to 125 in series, of these, to connect the gates of the TFTs 121 to 123 to the gate signal line 128, and to connect the gates of the other TFTs 124 and 125 to the capacitance line 130. Thus, for a period of time maintaining a voltage of a pixel, capacitors are formed between the channel and the gate electrode of each of the TFTs 124 and 125 by maintaining the capacitance line at a suitable voltage.

Thus the voltage between the source and the drain of each of the TFTs 122 and 123 is reduced, thereby decreasing the OFF current of the TFTs. An auxiliary capacitor is not absolutely necessary. Rather, since it increases the load during data writing, there are cases in which it is preferably not included, if the ratio between the capacitance of the pixel cell and that generated in the TFTs 124 and 125 is optimum.

To describe the action specifically with FIG. 2C: when a selection signal is applied to the gate signal line 128, all the TFTs 121 to 123 are turned on. In order for the TFTs 124 and 125 also to be ON, it is necessary to apply a signal to the capacitance line 130. Thus, the pixel cell 127 is charged in accordance with a signal on the image signal line 129, and at the same time the TFTs 124 and 125 are also charged. At the (equilibrium) stage when sufficient charging has performed, the voltages between the source and the drain of the TFTs 122 and 123 are approximately the same.

If, in this state, the selection signal is not applied or disconnected, the TFTs 121 to 123 are turned off. At this stage, the TFTs 124 and 125 are still in an ON state. An another pixel signal is subsequently applied to the image signal line 129. Since the TFT 121 has a finite OFF current, the charge stored in the TFT 124 is discharged, so that the voltage reduces. However, the speed thereof is approximately the same as the speed at which the voltage drops in the capacitor 102 in the normal active matrix circuit of FIG. 2A.

In the TFT 122, since the voltage between the source and the drain is initially approximately zero, the OFF current is extremely small, but subsequently the voltage of the TFT 124 reduces, and thus the voltage between the source and the drain of the TFT 122 gradually increases, and consequently the OFF current also increases. In the TFT 123, the OFF current also increases gradually in the same way, but the rate thereof is also even smaller than that of the TFT 122. From the above, the voltage drop of the pixel cell 127 due to the increase in the OFF current of the TFTs is much slower than with the normal active matrix circuit of FIG. 2A.

If LDD regions and offset regions are formed in the channels of the TFTs 121 to 125, then these regions become a drain resistor and a source resistor. Thus, it is possible to weaken the electric field strength at the drain junction and to reduce the OFF current.

The integration of such a circuit can be increased by a circuit arrangement, in FIG. 1A, such that the gate signal line 128 and the capacitance line 129 are overlapped on an approximately M-shaped semiconductor region 100. FIG. 1B to 1D show possible combination arrangements at this time, and the same effects are obtained whichever of these is employed.

FIG. 1B is the most orthodox form. TFTs 121 to 125 are formed at the intersections of the semiconductor region 100 with the gate signal line 128 and the capacitance line 130 (three intersections with the gate signal line and two intersections with the capacitor line: a total of five intersections). An N-type or P-type impurity is introduced into the regions (four regions in FIG. 13) of the semiconductor region separated (enclosed) by the gate signal line and the capacitance line, and the regions at both ends of the semiconductor region, then these become the source and the drain of the TFT. The image signal size and the pixel electrode should be formed such that they are connected to either of the ends of the semiconductor region. (FIG. 1B).

It is possible, in FIG. 1C, for the points a and b not to be covered by the capacitance line 130. This is because it is sufficient for the TFTs 124 and 125 only to function as capacitors.

In FIG. 1D, it is possible to construct TFTs 131 to 136 by forming six intersections with the semiconductor region 100. This circuit is shown in FIG. 2D, and the TFT 122 in FIG. 2C is simply replaced with two serial TFTs. In FIG. 2D, numeral 137 is a pixel cell, numeral 138 is a gate signal line, numeral 139 is an image signal line, and numeral 140 is a capacitance line. It is thus possible to reduce the OFF current in comparison with that in FIG. 2C.

DETAILED DESCRIPTION OF THE PREFERRED EMBODIMENTS

Embodiment 1

In the embodiment, an offset gate region and an LDD (lightly doped drain) region are constructed by anodizing a gate electrode to decrease an OFF current. A method for anodizing the gate electrode is disclosed in Japanese Patent Application Open No. 5-267667. FIGS. 1A to 1D show the circuit of the embodiment when viewed from above, and FIGS. 3A to 3F are a cross sectional view of the producing process. In the figures, the left side shows a cross section of the portion indicated by the dot-dash line X-Y in FIG. 1A, and the right side shows a cross section of the portion indicated by X'-Y'. They are drawn adjacent, but it should be noted that clearly X-Y and X'-Y' are not on the same straight line.

A silicon oxide film 302 with a thickness of 1000 to 5000 Å, e.g., 3000 Å, is formed as a base film on a substrate (Corning 7059 glass, 100 mm×100 mm) 301. TEOS (tetraethoxysilane) is decomposed and deposited by plasma CVD (chemical vapor deposition) to form the silicon oxide film 302. This process may also be performed by sputtering.

An amorphous silicon film with a thickness of 300 to 1500 Å, e.g., 500 Å, is deposited by plasma CVD or low pressure CVD (LPCVD) and then left for 8 to 24 hours in an atmosphere at 550 to 600° C. to crystallize it. The crystallization may be promoted by adding a small amount of nickel. A method for promoting crystallization by adding nickel or the like, to reduce the crystallization temperature and to shorten the crystallization time, is provided in Japanese Patent Application Open No. 6-244104. This process may also be performed by photo-annealing with laser irradiation, or a combination of thermal annealing and photo-annealing.

Figure 1A:
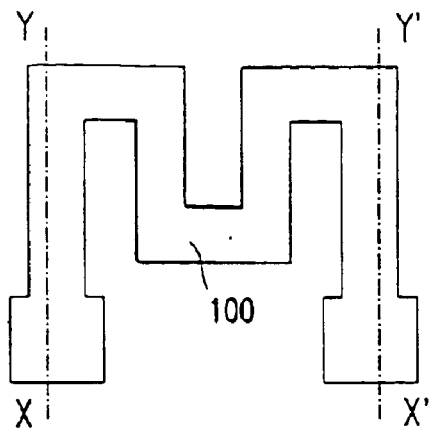
FIGS. 1A to 1D show the arrangement of a semiconductor region, a gate signal line and a capacitance line in the present invention.
Figure 1B:
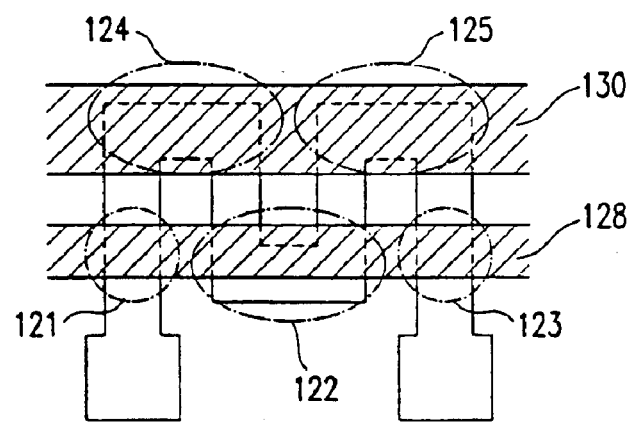
Figure 1C:
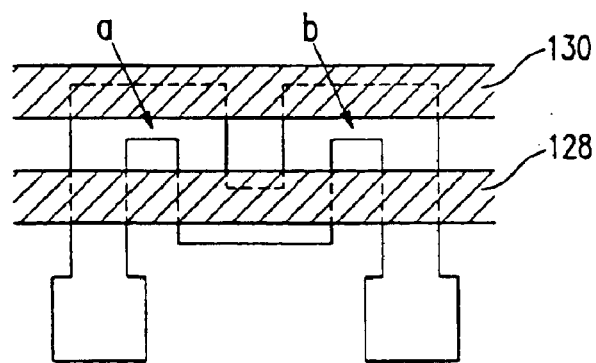
Figure 1D:
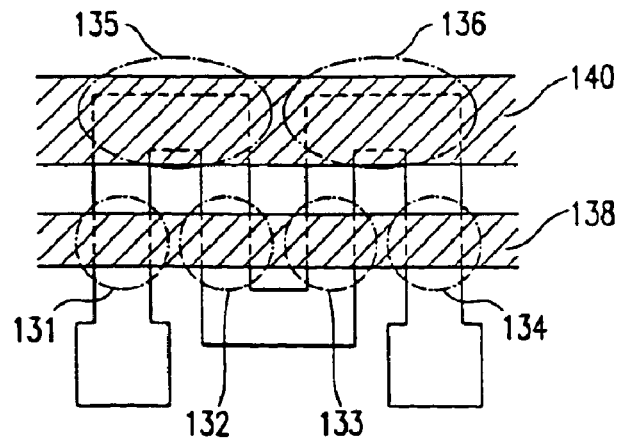
Figure 3A:
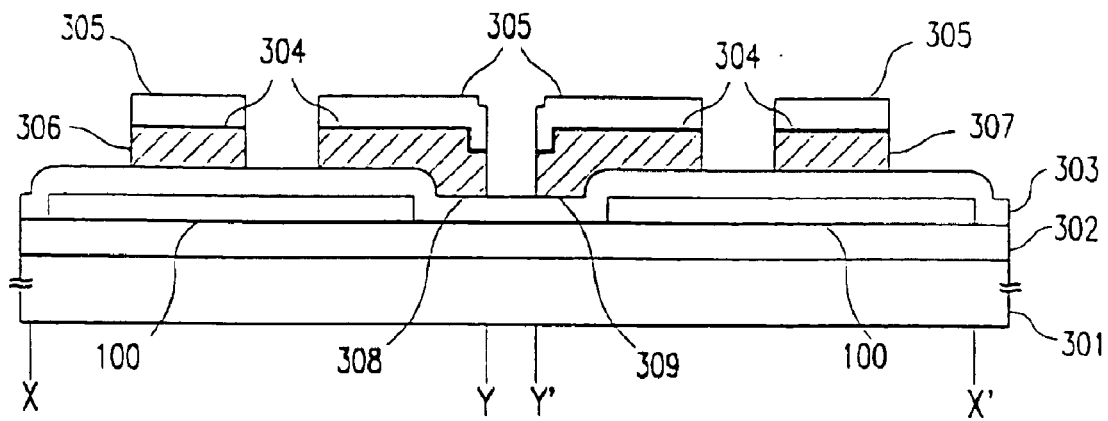
FIGS. 3A to 3F show a producing process (cross section view) of switching elements in Embodiment 1.

The crystallized silicon film is etched to form an approximately M-shaped island-shaped region 100. A silicon oxide film 303 with a thickness of 700 to 1500 Å, e.g., 1200 Å, is formed on the region 100 by plasma CVD or sputtering. (FIGS. 1A and 3A)

An aluminum (containing 1 weight % Si, or 0.1 to 0.3 weight % Sc) film is formed to a thickness of 1000 Å to 3 μm, e.g., 5000 Å, by sputtering. Then, by anodization, in an ethylene glycol solution containing 3% tartaric acid, using the aluminum film as an anode, a voltage of 10 to 30 V is applied to form an anodic oxide layer 304 made of a fine aluminum oxide having a thickness of about several 100 Å, 200 Å in this embodiment. The anodic oxide layer 304 is used to adhere a photoresist at a high degree of adhesion.

After forming a photoresist mask 305, the aluminum film is etched using the photoresist mask 304 to form gate electrodes 306 to 309. The gate electrodes 306 and 307 correspond to the gate signal line 128, and the gate electrodes 308 and 309 correspond to the capacitance line 130. (FIG. 3A)

Figure 9:
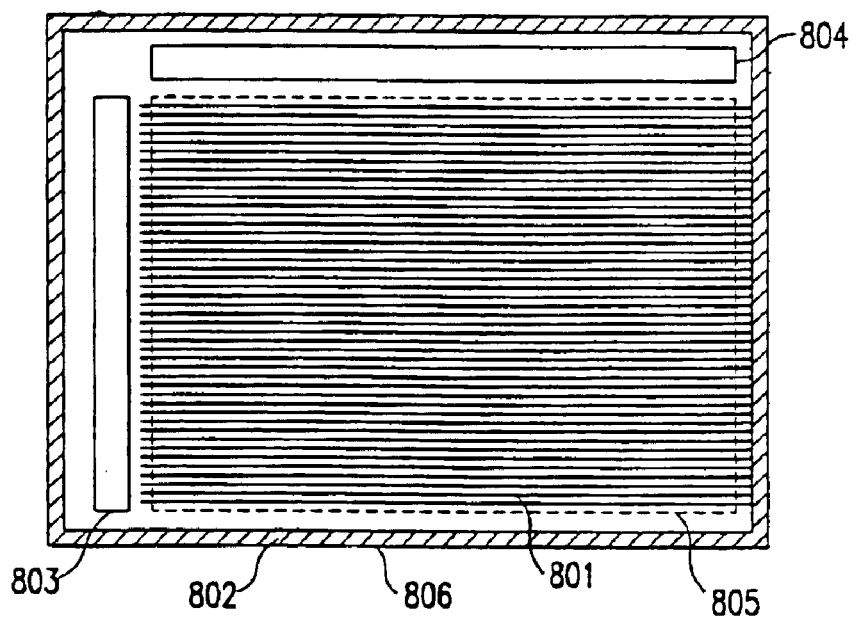
FIG. 9 shows the arrangement of the gate signal line, the capacitance line, the peripheral circuit or the like in Embodiment 3.

At this stage, in FIG. 9, etching may be performed so that an aluminum film region 802 is formed around an active matrix region 805 on a substrate 806 and all of the gate signal and capacitance lines (the aluminum wirings) 801 are connected to the aluminum film region 802. If the aluminum wirings of the gate electrodes or the like of the peripheral circuit (the gate driver 803 and the source driver 804) are designed to insulate them from the aluminum film region 802, anodization does not occur in the aluminum wirings of the peripheral circuit, thereby to improve the integration. (FIG. 9)

Figure 3B:
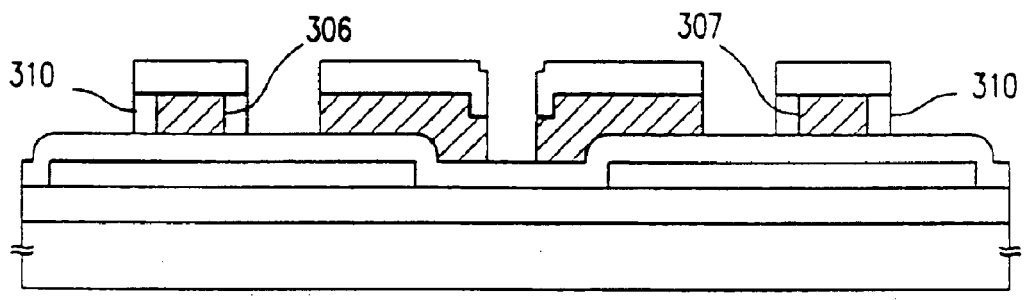

Without removing the photoresist mask 305, only the gate electrodes 306 and 307, i.e., only the gate signal line 128 is anodized to form a porous anodic oxide 310. In this process, a voltage of 10 to 30 V may be applied to only the gate electrodes 306 and 307, i.e., only the gate signal line 128 in an acid solution such as 3 to 20% citric acid, oxalic acid, phosphoric acid, chromic acid and sulfuric acid. In the embodiment, a voltage of 10 V is applied for 20 to 40 minutes in an oxalic acid solution (30° C.). At this state, since the photoresist mask 305 is adhered by the anodic oxide layer 304, a leak of a current from the photoresist mask 305 can be prevented, so that it is extremely effective to form a porous anodic oxide 310 in only side surfaces of the gate electrodes 306 and 307. A thickness of the porous anodic oxide 310 can be adjusted in accordance with an anodization time, so that a length of an LDD region is determined by the thickness of the porous anodic oxide 310. (FIG. 3B)

Figure 3C:
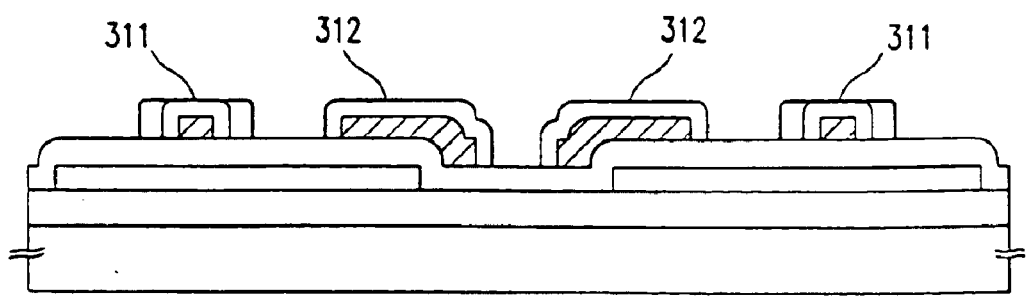

After removing the photoresist mask 305, a current is passed again through the gate electrodes 306 to 309, i.e., the gate signal line 138 and the capacitance line 130 (FIG. 1B) in an electrolytic solution to perform anodization, so that an anodic oxide with a thickness of 500 to 2500 Å is formed. The electrolytic solution is obtained by diluting L-tartaric acid with ethylene glycol to a concentration of 5% and adjusting to a pH of 7.0±0.2 using ammonia. The substrate is immersed into the solution. The positive side of a constant current source is connected to the gate electrodes on the substrate, and the negative side is connected to a platinum electrode. A voltage is applied with a constant current of 20 mA, and oxidation is continued until the voltage reaches 150 V. Also, oxidation is continued with a constant voltage of 150 V until the current decreases below 0.1 mA. Thus, aluminum oxide films 311 and 312 with a thickness of 2000 Å are obtained on upper and side surfaces the gate signal line 128 (gate electrodes 306 and 307) and the capacitance line 130 (gate electrodes 308 and 309) and have a fine crystalline structure. A thickness of the aluminum oxide film 311 and 312 may be determined by a length of an offset and is proportional to an applying voltage. (FIG. 3C)

Figure 3D:
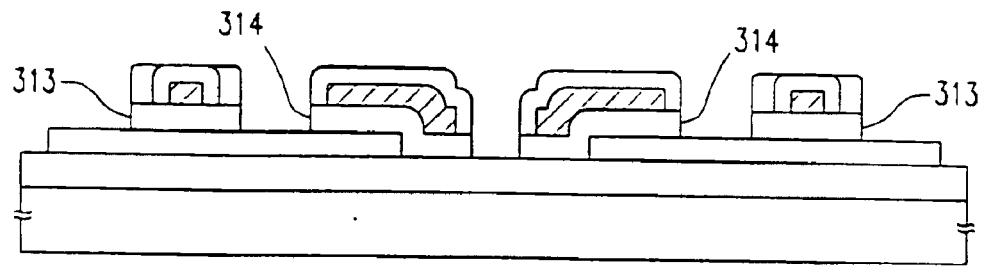

Using the anodic oxides 311 and 312 formed around the gate electrodes 306 to 309 as masks, the silicon oxide film 303 is etched to from gate insulating films 313 and 314. In this state, it is necessary to use an etching gas or an etching solution that a selection ratio between silicon and silicon oxide is sufficiently large. (FIG. 3D)

Figure 3E:
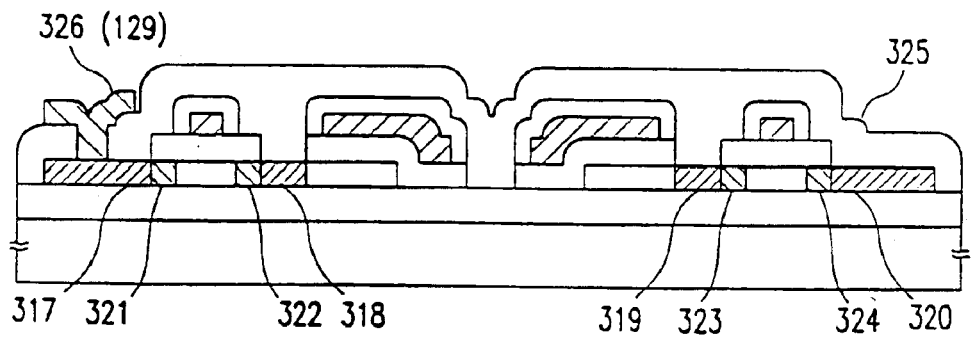

After removing the porous anodic oxide 310, an impurity (phosphorus) is implanted into the island-shaped region 100 in a self-alignment by ion doping with the gate electrode portions (the gate electrodes and the anodic oxides at the periphery thereof) and the gate insulating film 313 as masks, to form N-type impurity regions. The doping gas is phosphine ($PH_3$). The dose is $5 \times 10^{14}$ and $5 \times 10^{15}$ atoms/$cm^2$, e.g., $1 \times 10^{15}$ atoms/$cm^2$ and the acceleration voltage is 60 to 90 kV, e.g., 80 kV. Thus, since the gate insulating film 313 is used as a semitransparent mask, high concentration impurity regions (source and drain regions) 317 to 320 and low concentration impurity regions 321 to 324 are formed. (FIG. 3E)

A KrF excimer laser (a wavelength of 248 nm, pulse width of 20 ns) is irradiated to activate the doped high concentration impurity regions 317 to 320 and the doped low concentration impurity regions 321 to 324. A suitable energy density of the laser is 200 to 400 mJ/$cm^2$, preferably 250 to 300 mJ/$cm^2$. This process may be performed by thermal annealing. In particular, activation can be performed by thermal annealing at a temperature lower than in the normal case, by including a catalyst element (nickel) (Japanese Patent Application Open No. 6-267989).

A silicon oxide film 325 is formed to a thickness of 5000 Å as an interlayer insulating film by plasma CVD. A row gas is TEOS and oxygen. The interlayer insulating film 325 is then etched to form a contact hole in the N-type impurity region 317. An aluminum film is formed by sputtering and then etched to form a source electrode-wiring 326. This is an extension of the image signal line 129. (FIG. 3E)

Then a silicon nitride film is formed to a thickness of 2000 to 8000 Å, e.g., 4000 Å as a passivation film 327 by plasma CVD using an $NH_3/SiH_4/H_2$ mixture gas. The passivation film 327 and the interlayer insulating film 325 are etched to form a contact hole for a pixel electrode in the high concentration impurity region 320.

Figure 3F:
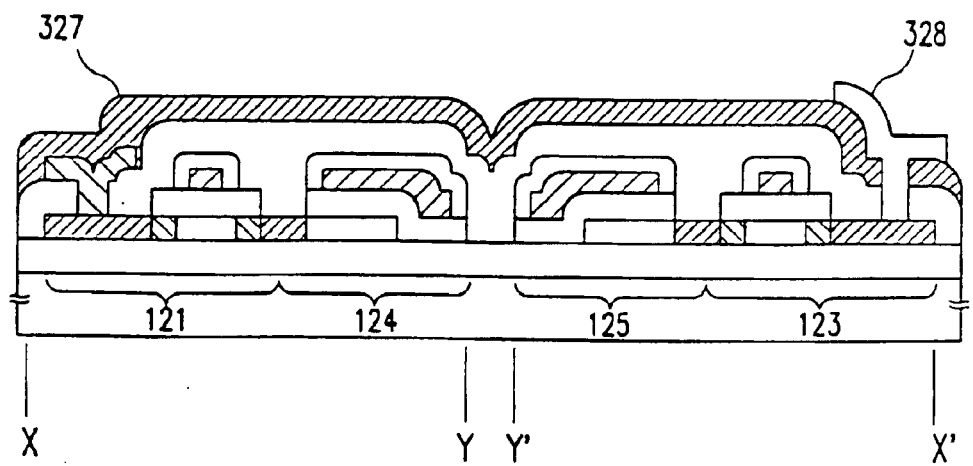

As indium tin oxide (ITO) film is formed by sputtering and then etched to form a pixel electrode 328. The pixel electrode 328 is one electrode of the pixel cell 127. (FIG. 3F)

By the above process, a switching circuit having N-channel type TFTs 121 to 125 is produced. This switching circuit correspond to a circuit obtained by removing the auxiliary capacitor 126 from the circuit of FIG. 2C. Note that the TFT 122 is not shown in FIG. 3F.

Low concentration impurity regions are spaced apart from the gate electrodes 306 and 307 by a thickness of the porous anodic aluminum film 311, and each of the low concentration impurity regions 321 to 324 are formed between the channel forming region and the source and drain regions, so that the TFT 121 to 123 have a so-called offset gate structure and an LDD structure, thereby reducing an OFF current. Thus, these TFTs are suitable as elements arranged in a pixel matrix. Since it is sufficient if the TFT 124 and 125 are used only as capacitors, an LDD structure may not be formed.

Embodiment 2

The embodiment is a modifying example of an LDD structure. FIGS. 1A to 1D show the circuit of the embodiment when viewed from above, and FIGS. 4A to 4F are a cross section view of the producing process. In the figures, the left side shows a cross section of the portion indicated by the dot-dash line X-Y in FIG. 1A, and the right side shows a cross section of the portion indicated by X'-Y', as similar to FIGS. 3A to 3F. They are drawn adjacent, but it should be noted that clearly X-Y and X'-Y' are not on the same straight line.

A silicon oxide film 402 having a thickness of 1000 to 5000 Å, e.g., 3000 Å, is formed as a base film on a substrate (Corning 7059 glass, 100 mm×100 mm) 401. TEOS is decomposed and deposited by plasma CVD to form the silicon oxide film 302. This process may also be performed by sputtering.

An amorphous silicon film having a thickness of 300 to 1500 Å, e.g., 500 Å, is deposited by plasma CVD or LPCVD and then left for 8 to 24 hours in an atmosphere at 550 to 600° C. to crystallize it. The crystallization may be promoted by adding a small amount of nickel. This process may also be performed by photo-annealing with laser irradiation or a combination of thermal annealing and photo-annealing.

The crystallized silicon film is etched to form an approximately M-shaped island region 100 of FIG. 1A. A silicon oxide film 403 with a thickness of 700 to 1500 Å, e.g., 1200 Å, is formed on the region 100 by plasma CVD or sputtering.

An aluminum (containing 1 weight % Si, or 0.1 to 0.3 weight % Sc) film is formed to a thickness of 1000 Å to 3 $\mu$m, e.g., 5000 Å, by sputtering. Then, by anodization, in an ethylene glycol solution containing 3% tartaric acid, using the aluminum film as an anode, a voltage of 10 to 30 V is applied to form an anodic oxide layer 404 made of a fine aluminum oxide having a thickness of about several 100 Å, 200 Å in this embodiment. The anodic oxide layer 404 is used to adhere a photoresist at a high degree of adhesion.

Figure 4A:
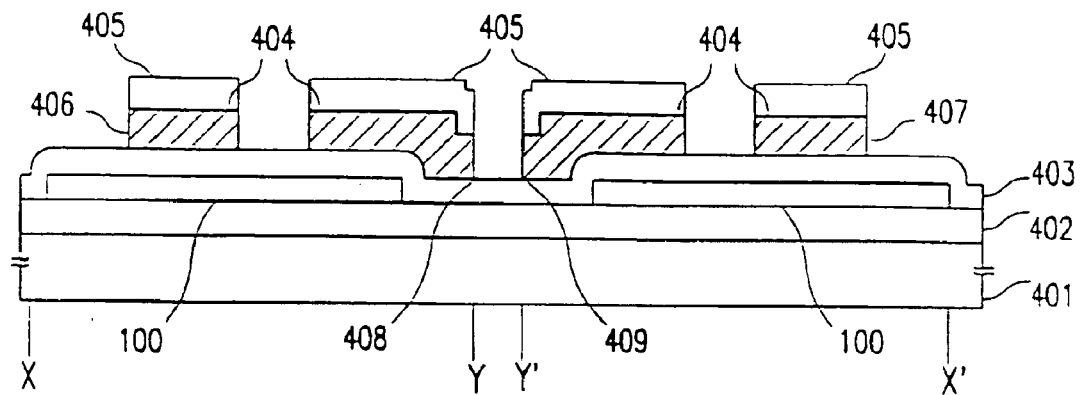
FIGS. 4A to 4F show a producing process (cross section view) of switching elements in Embodiment 2.

After forming a photoresist mask 405, the aluminum film is etched using the photoresist mask 405 to form gate electrodes 406 to 409. The gate electrodes 406 and 407 correspond to the gate signal line 128, and the gate electrodes 408 and 409 correspond to the capacitance line 130. (FIG. 4A)

Figure 4B:
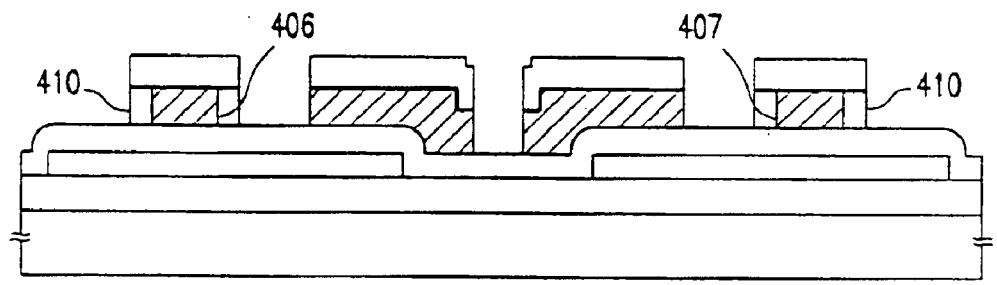
Figure 4C:
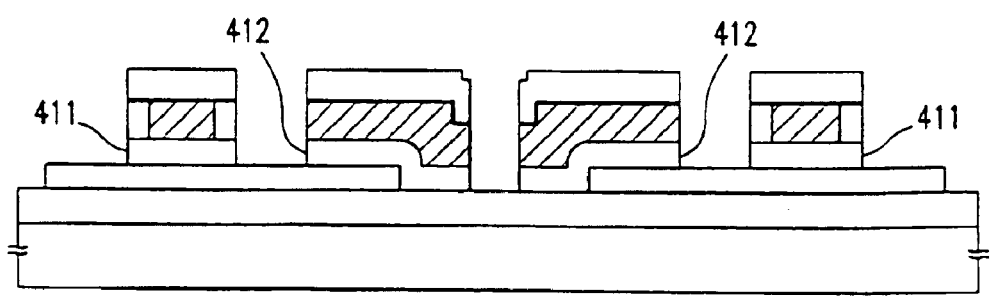
Figure 4D:
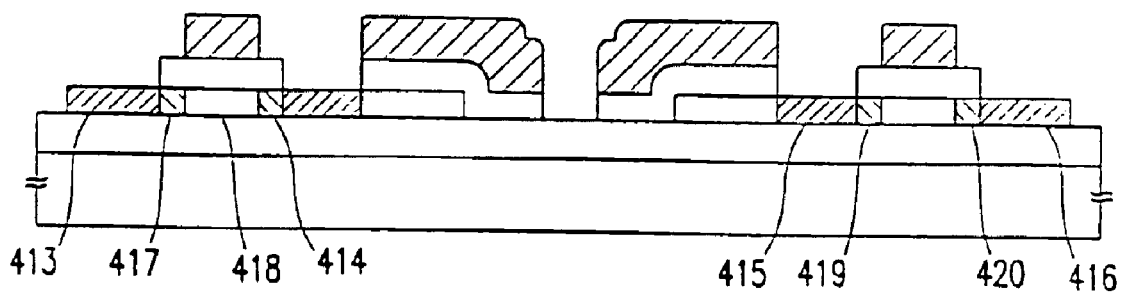

Without removing the photoresist mask 405, only the gate electrodes 406 and 407 are anodized to form a porous anodic oxide 410. In this process, a voltage of 10 V is applied to only the gate signal line 128 for 20 to 40 minutes in an oxalic acid solution (30° C.). Since the photoresist mask 405 is adhered by the anodic oxide layer 404, a leak of a current from the photoresist mask 405 can be prevented, so that it is extremely effective to form the porous anodic oxide 410 in only side surfaces of the gate electrodes 406 and 407. A thickness of the porous anodic oxide 410 can be adjusted in accordance with an anodization time, so that a length of an LDD region is determined by the thickness of the porous anodic oxide 410. (FIG. 4B)

Using the photoresist mask 405, the silicon oxide film 403 is etched to from gate insulating films 411 and 412. After removing the photoresist mask 405, the porous anodic oxide 410 and the fine anodic oxide layer 404 sequentially, an impurity (phosphorus) is implanted into the island-shaped region 100 in a self-alignment by ion doping with the gate electrodes 406 to 409 and the gate insulating film 411 as masks, to form N-type impurity regions. The doping gas is phosphine (PH$_3$). The dose is $5\times10^{14}$ and $5\times10^{15}$ atoms/cm$^2$, e.g., $1\times10^{15}$ atoms/cm$^2$ and the acceleration voltage is 60 to 90 kV, e.g., 80 kV. Since the gate insulating film 411 is used as a semitransparent mask, high concentration impurity regions (source and drain regions) 413 to 416 and low concentration impurity regions 417 to 420 are formed. (FIG. 3D)

A KrF excimer laser (a wavelength of 248 nm, pulse width of 20 ns) is irradiated to activate the doped high concentration impurity regions 413 to 416 and the doped low concentration impurity regions 417 to 420. A suitable energy density of the laser is 200 to 400 mJ/cm$^2$, preferably 250 to 300 mJ/cm$^2$. This process may be performed by thermal annealing. In particular, activation can be performed by thermal annealing at a temperature lower than in the normal case, by including a catalyst element (nickel) (Japanese Patent Application Open No. 6-267989).

Figure 4E:
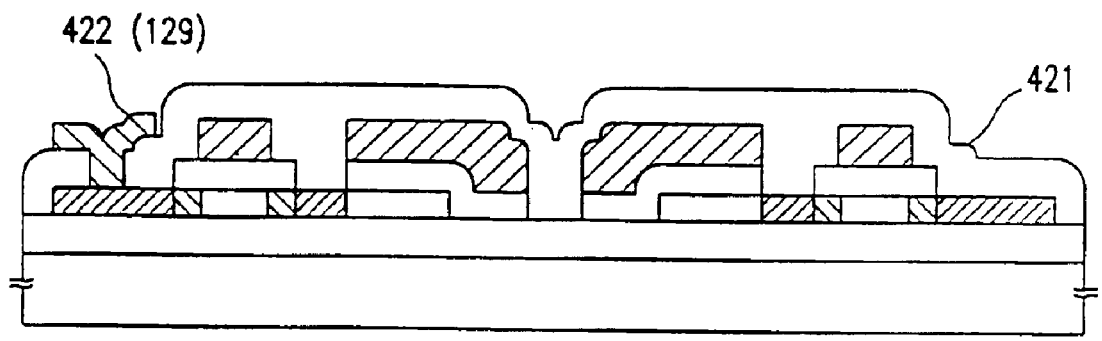

A silicon oxide film 325 is formed to a thickness of 5000 Å as an interlayer insulating film 421 by plasma CVD. A raw gas is TEOS and oxygen. The interlayer insulating film 421 is then etched to form a contact hole. In the high concentration impurity region 413. An aluminum film is formed by sputtering and then etched to form a source electrode-wiring 422. This is an extension of the image signal line 129. (FIG. 4E)

Then a silicon nitride film is formed to a thickness of 2000 to 8000 Å, e.g., 4000 Å as a passivation film 423 by plasma CVD using an NH$_3$/SiH$_4$/H$_2$ mixture gas. The passivation film 423 and the interlayer insulating film 421 are etched to form a contact hole for a pixel electrode in the high concentration impurity region 416.

Figure 4F:
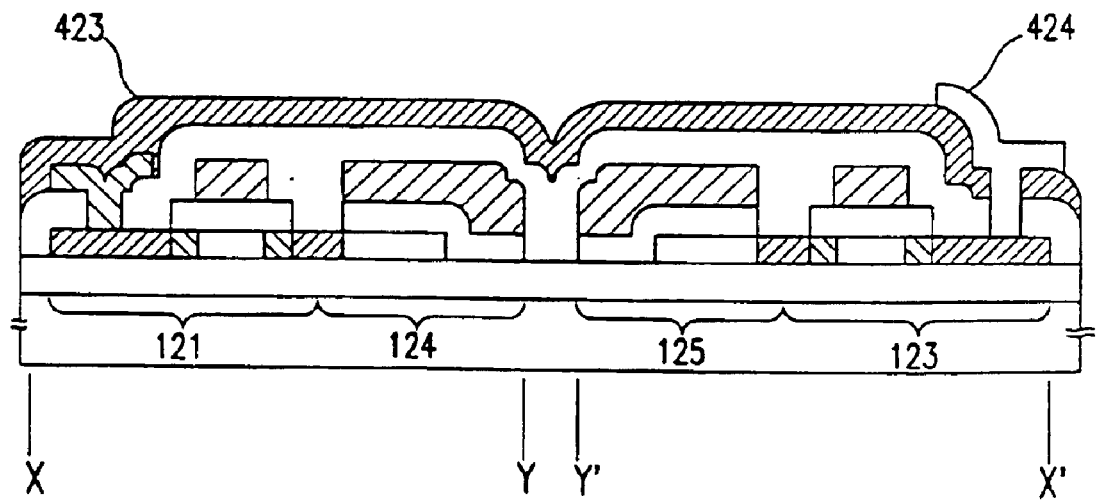

An ITO film is formed by sputtering and then etched to form a pixel electrode 424. The pixel electrode 424 is one electrode of the pixel cell 127. (FIG. 4F)

By the above process, a switching circuit having N-channel type TFTs 121 to 125 is produced. This switching circuit correspond to a circuit obtained by removing the auxiliary capacitor 126 from the circuit of FIG. 2C. Note that the TFT 122 is not shown in FIG. 4F.

Each of the low concentration impurity regions 417 to 420 are formed between the channel forming region and the source and drain regions, so that the TFT 121 to 123 have an LDD structure, thereby reducing an OFF current. Thus, these TFTs are suitable as elements arranged in a pixel matrix. Since it is sufficient if the TFT 124 and 125 are used only as capacitors, an LDD structure may not be formed.

Embodiment 3

FIGS. 5A to 5F show the process for forming the circuit in the embodiment. A detailed description of the specific processes is not given since a known method (or the method in embodiment 1) should be used.

Figure 5A:
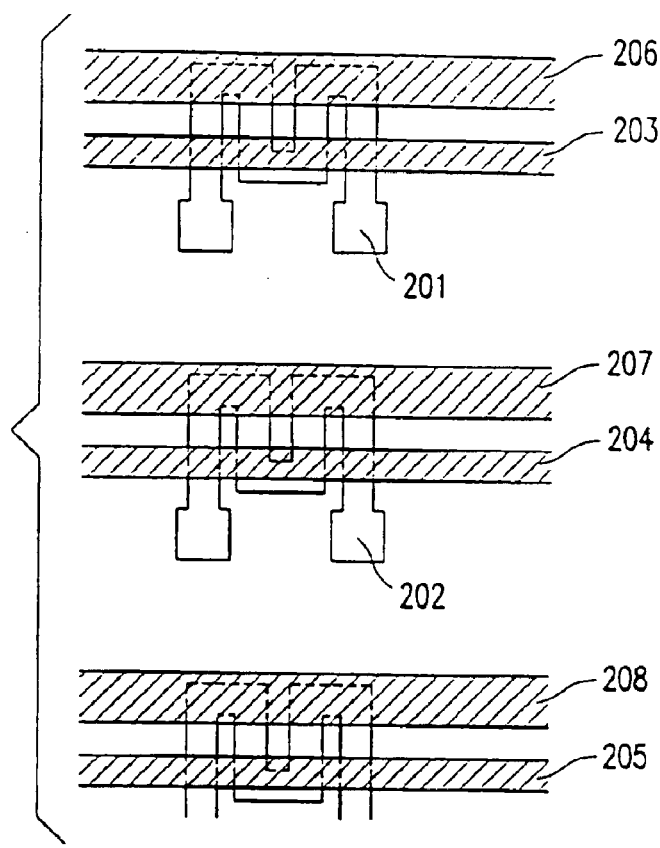
FIGS. 5A to 5F show a producing process (upper view) of switching elements in Embodiment 3.

An approximately M-shaped semiconductor regions (active layers) 201 and 202 as in Embodiment 1 (or FIG. 1A) are formed. After a gate insulating film (not shown) is formed the gate signal lines 203 to 205 and the capacitance lines 106 to 208 are formed. The positional relationship between the gate signal lines, the capacitance lines and the active layers are the same as in Embodiment 1. (FIG. 5A)

Figure 5B:
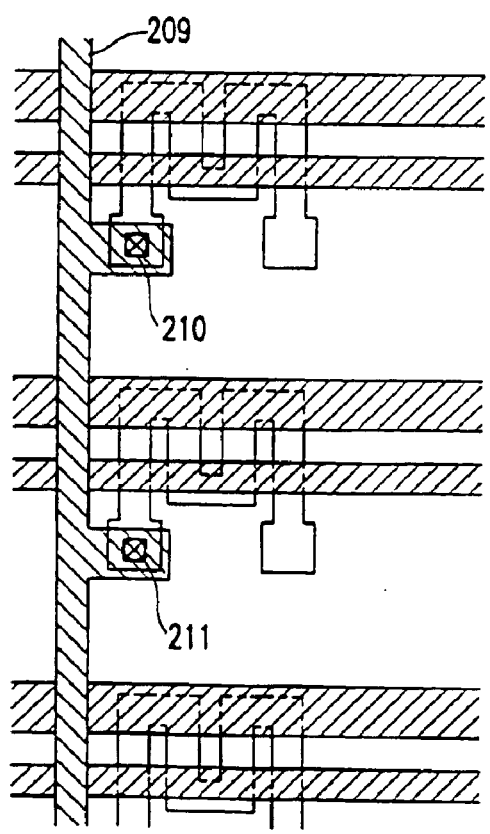

After doping the active layers 201 to 204, an interlayer insulator is formed, and then the contact holes 210 and 211 are formed at the left ends of the active layers, thereby forming the image signal line 209. (FIG. 5B)

Figure 5C:
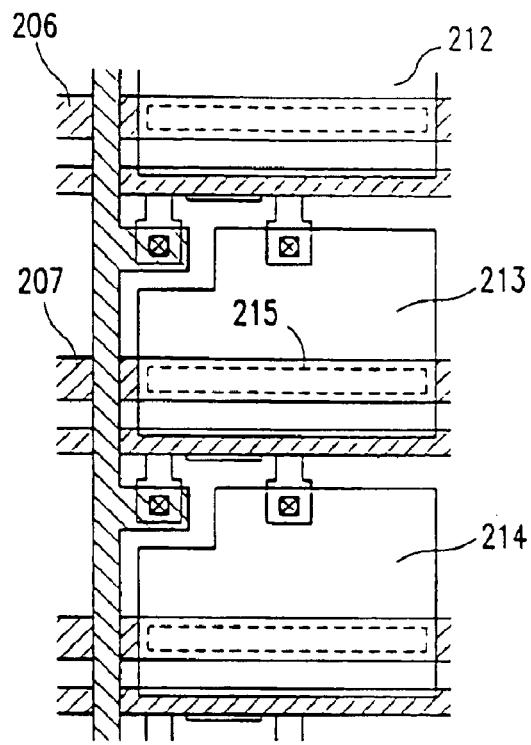

Pixel electrodes 212 to 214 are formed in regions surrounded by the gate signal lines and the image signal line. By the above processes, switching elements for an active matrix circuit are formed. The capacitance line 206 is not overlapped with the pixel electrode 213 of a corresponding line, but it is overlapped with the pixel electrode 212 which is one line higher. Thus, a capacitor 215 corresponding to the auxiliary capacitor 126 is formed between the capacitance line 207 and the pixel electrode 213. With respect to the other lines, the same arrangement is obtained. (FIG. 5C)

Figure 7:
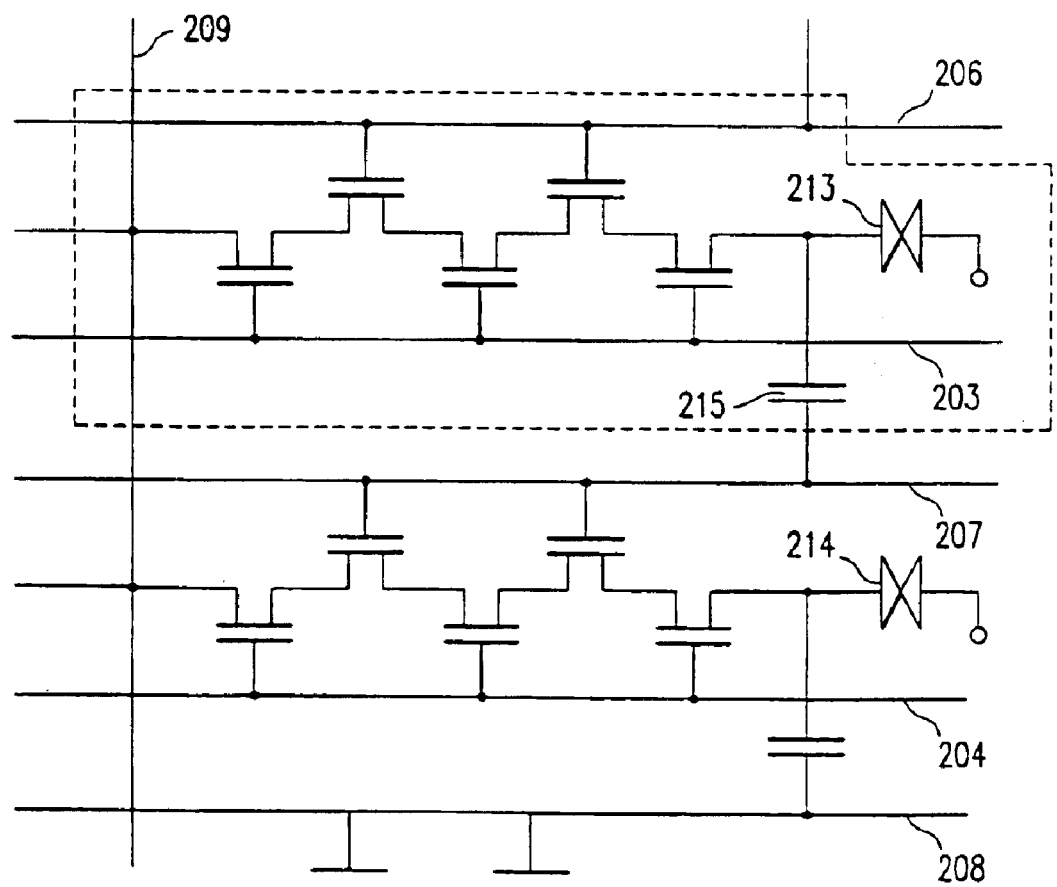
FIG. 7 shows a circuit of the switching element in Embodiment 3.

By the arrangement that the pixel electrode of a corresponding line is overlapped with the gate signal line which is one line higher (or lower), the circuit of FIG. 7 is constructed. Since the capacitor 215 is formed on the capacitance line, a capacitor can be formed without reducing an aperture ratio. Thus it is effective to improve the integration of the circuit.

Figure 6:
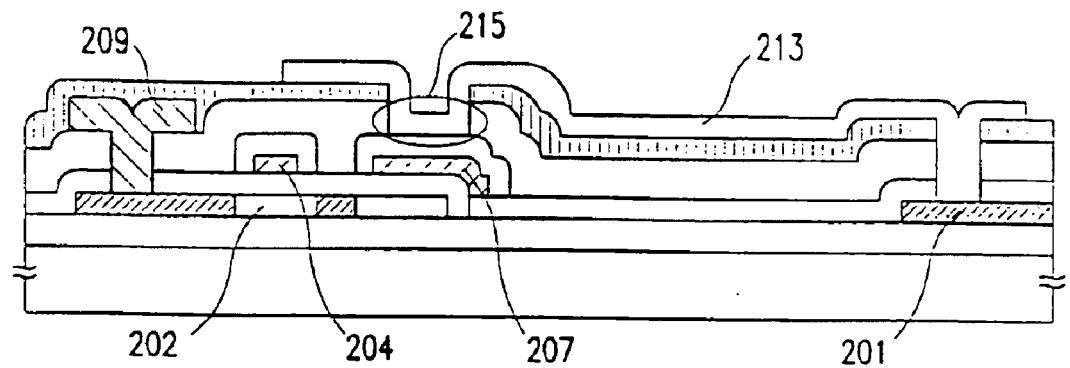
FIG. 6 is a cross section view of the switching elements in Embodiment 3.

To enlarge the capacitor 215, an interlayer insulator in an overlapping portion may be etched. By this, a distance between electrodes is shortened and thus a capacitance is increased. To achieve this, as in Embodiment 1, it is better that the capacitance line whose surface is covered with the anodic oxide is formed. In this state, the anodic oxide is dielectric. The cross section is shown in FIG. 6.

The number of processes is not increased by etching a corresponding portion to form the capacitor 215. That is, then an interlayer insulator is etched to form contact holes for pixel electrodes or the contact holes 210 and 211, holes may be formed on the capacitance lines at the same time. FIG. 6 shows the latter example. In a suitable etching condition, since an anodic oxide of aluminum or the like is not etched at all in a dry etching condition for etching a silicon oxide, etching is continued until a contact hole is formed.

Figure 5D:
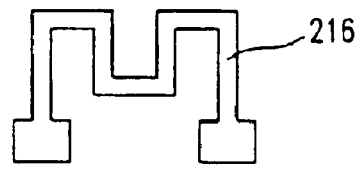
Figure 5E:
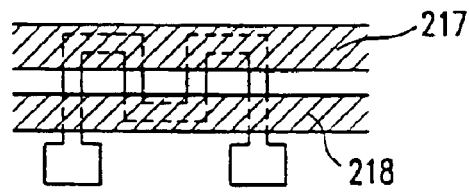
Figure 5F:
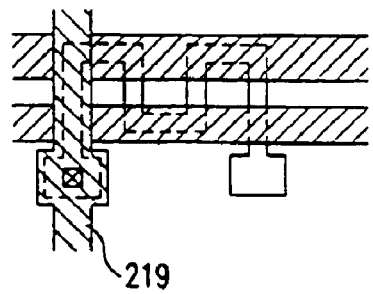
Figure 8A:
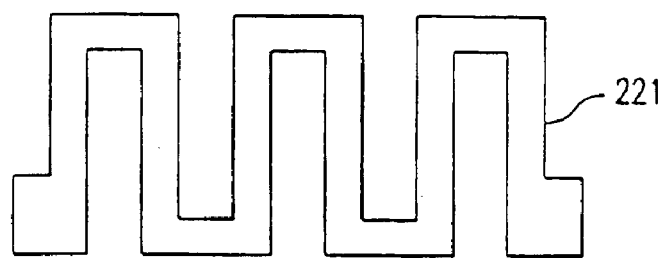
FIGS. 8A and 8B show the arrangement of a semiconductor region, a gate signal line and a capacitance line in Embodiment 3.
Figure 8B:
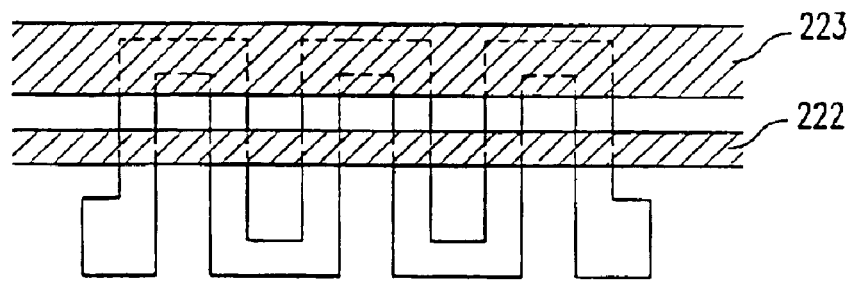

To increase the aperture ratio, in FIG. 5D to 5F, it is also effective to overlap a semiconductor region 216, i.e., a portion of the TFT with the image signal line 219. Also, an island-shaped semiconductor region 221 has complex bending portions in FIG. 8A, and then a gate signal line 222 and a capacitance line 223 are overlapped on the region 221 (FIG. 8B), so that a large number of TFTs can be formed. Thus, it is possible to further reduce an OFF current.

Embodiment 4

Figure 10:
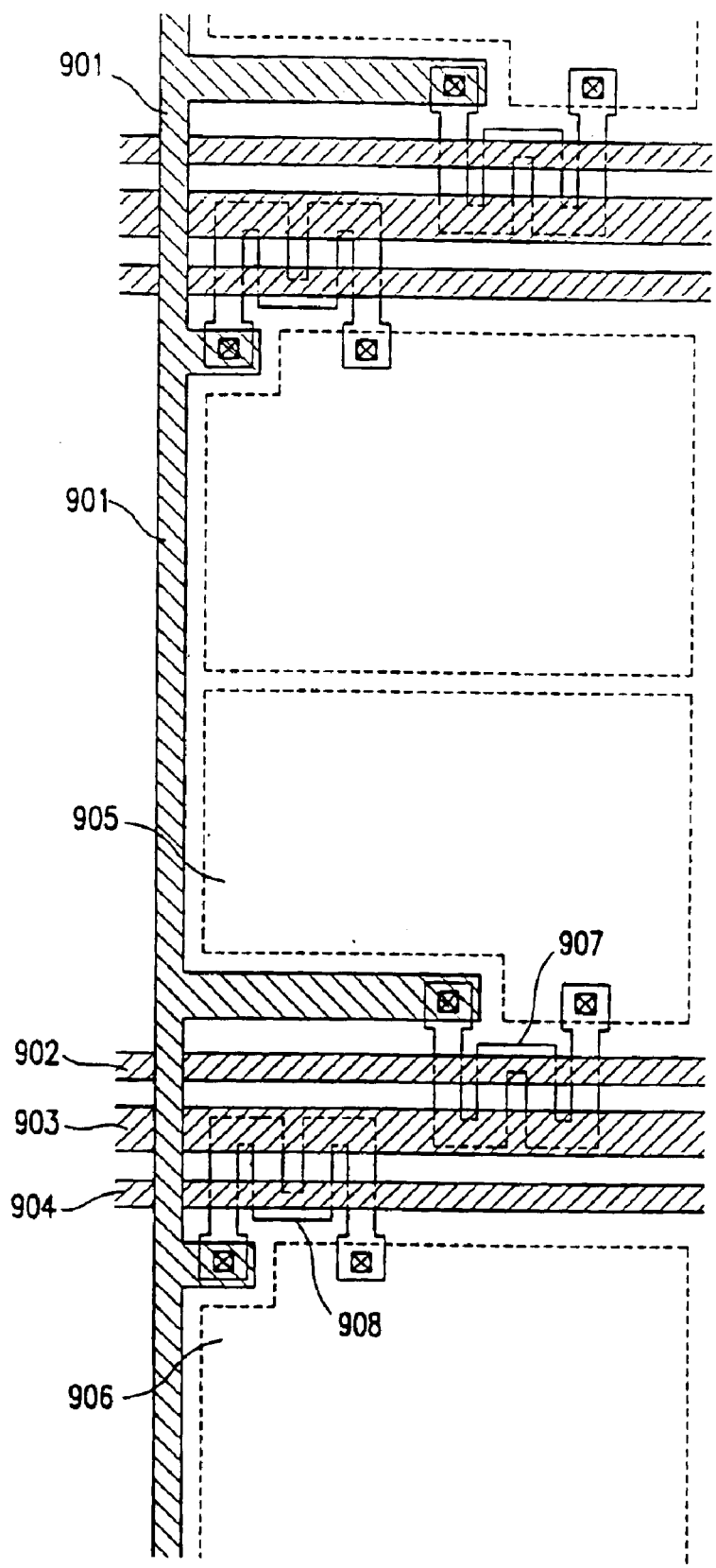
FIG. 10 is an upper view of pixel regions in Embodiment 4.
Figure 11:
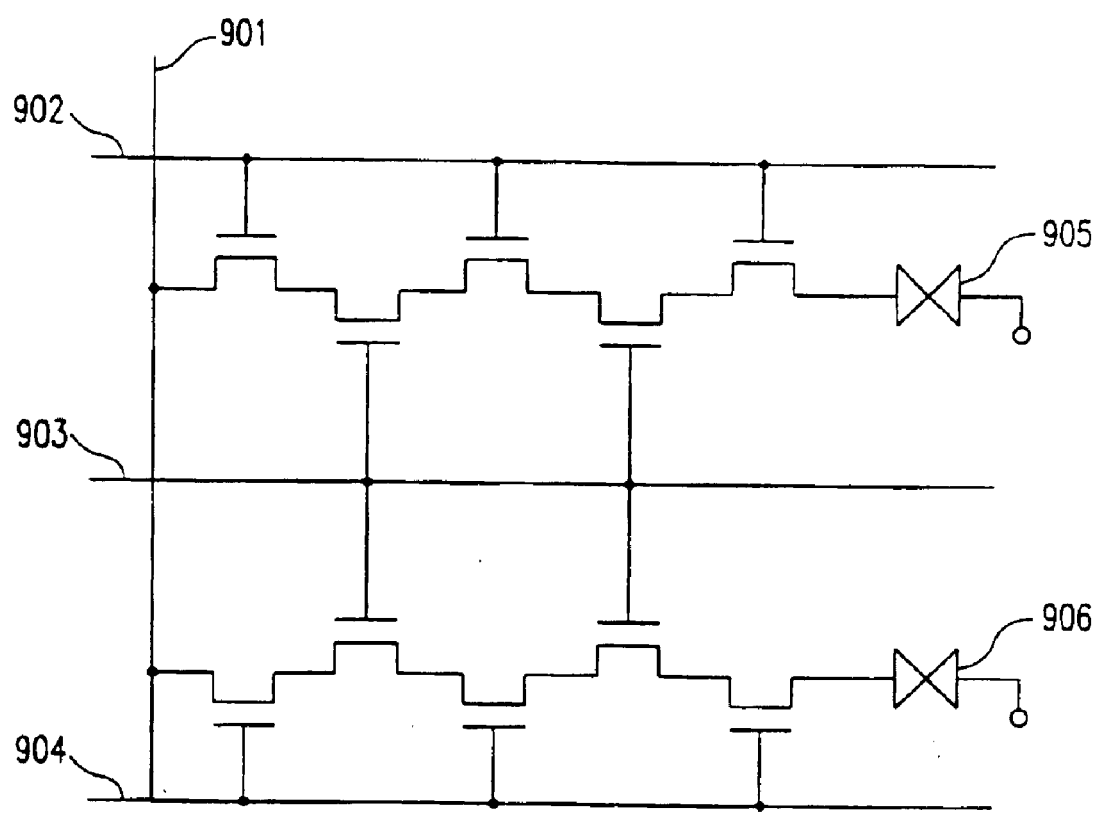
FIG. 11 shows an equivalent circuit of the structure of FIG. 10.

The embodiment is a modifying example of the structure obtained by the process of FIG. 5A to 5C. FIG. 10 is a schematic view of the embodiment. FIG. 11 shows an equivalent circuit of the structure of FIG. 10. The structure of FIG. 10 is characterized in that TFT groups arranged in adjacent two pixels along a gate signal line direction are connected to a common capacitance line. Gate signal lines 902 and 904 are arranged between adjacent pixel electrodes 905 and 906, and a capacitance line 903 is arranged between the gate signal lines 902 and 904. One ends of M-shaped island semiconductor regions 907 and 908 are connected to the pixel electrodes 905 and 906, respectively.

The M-shaped island semiconductor regions 907 and 908 is constructed by a crystalline silicon film to use them as active layers of TFTs. In the semiconductor regions 907 and 908, TFTs are formed at three portions overlapped with the gate signal lines 902 and 904, and offset regions and LDD regions may be formed in these TFTs, as described in Embodiments 1 and 2. Two portions overlapped with the capacitance line 903 is used as a capacitor.

Since one (single) capacitance line 903 is used in common for one pair of pixel electrodes 905 and 904, the number of capacitance lines can be halved, thereby increasing an aperture ratio of a pixel. In FIG. 10, only a minimum structure is shown. In a liquid crystal display device in practice, several hundreds×several hundreds structures (each is the structure of FIG. 10) are combined.

Embodiment 5

Figure 12:
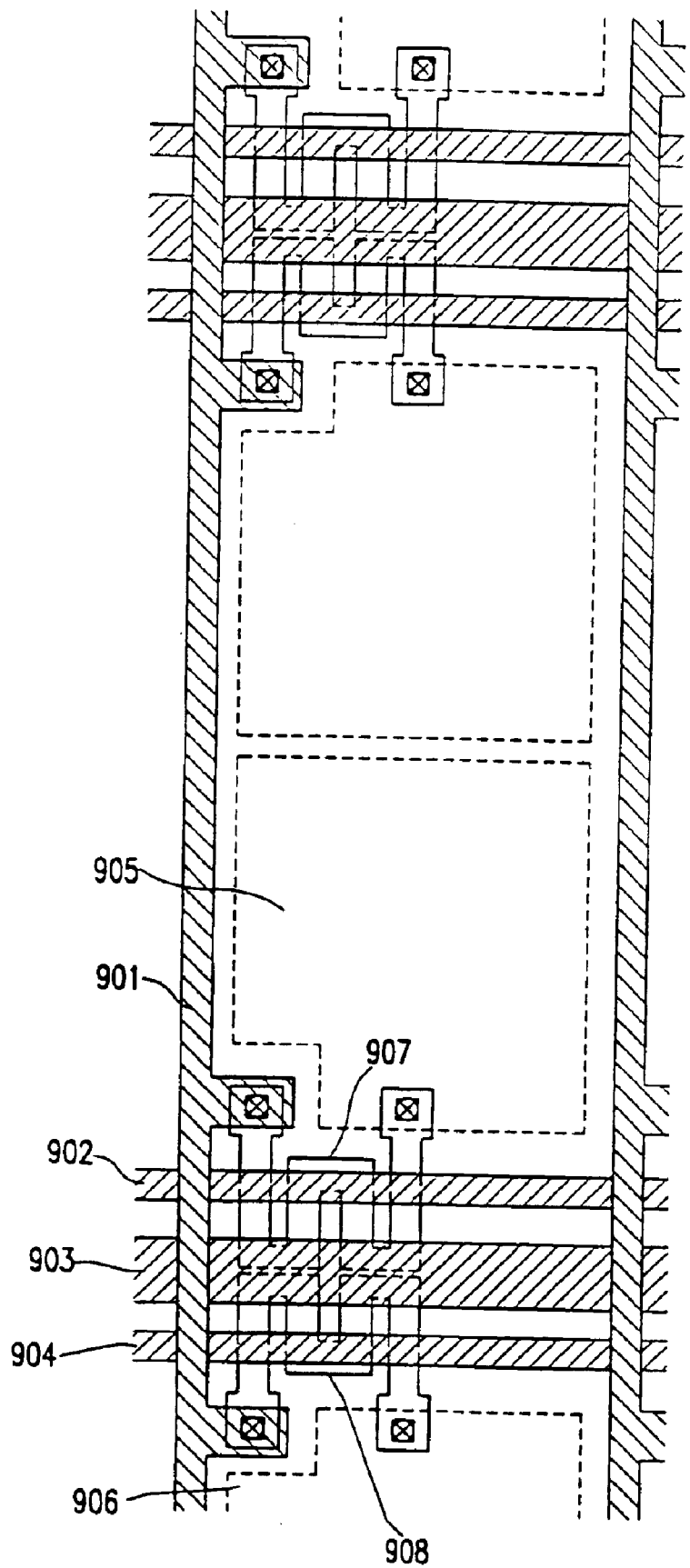
FIG. 12 is an upper view of pixel regions in Embodiment 5.

The embodiment relates to a modifying structure of the structure of FIG. 10. FIG. 12 is a plane view of the structure of the embodiment. The feature of the structure of FIG. 12 is a manner for utilizing the common capacitance line 903 for two pixels. This is apparent if the structure of FIG. 12 is compared with that of FIG. 10.

FIG. 11 shows the equivalent circuit of the structure of the embodiment. That is, The equivalent circuit of structure of FIG. 12 is the same circuit as that of FIG. 10. By using such the structure of the embodiment, an aperture ration can be increased.

Embodiment 6

Figure 13:
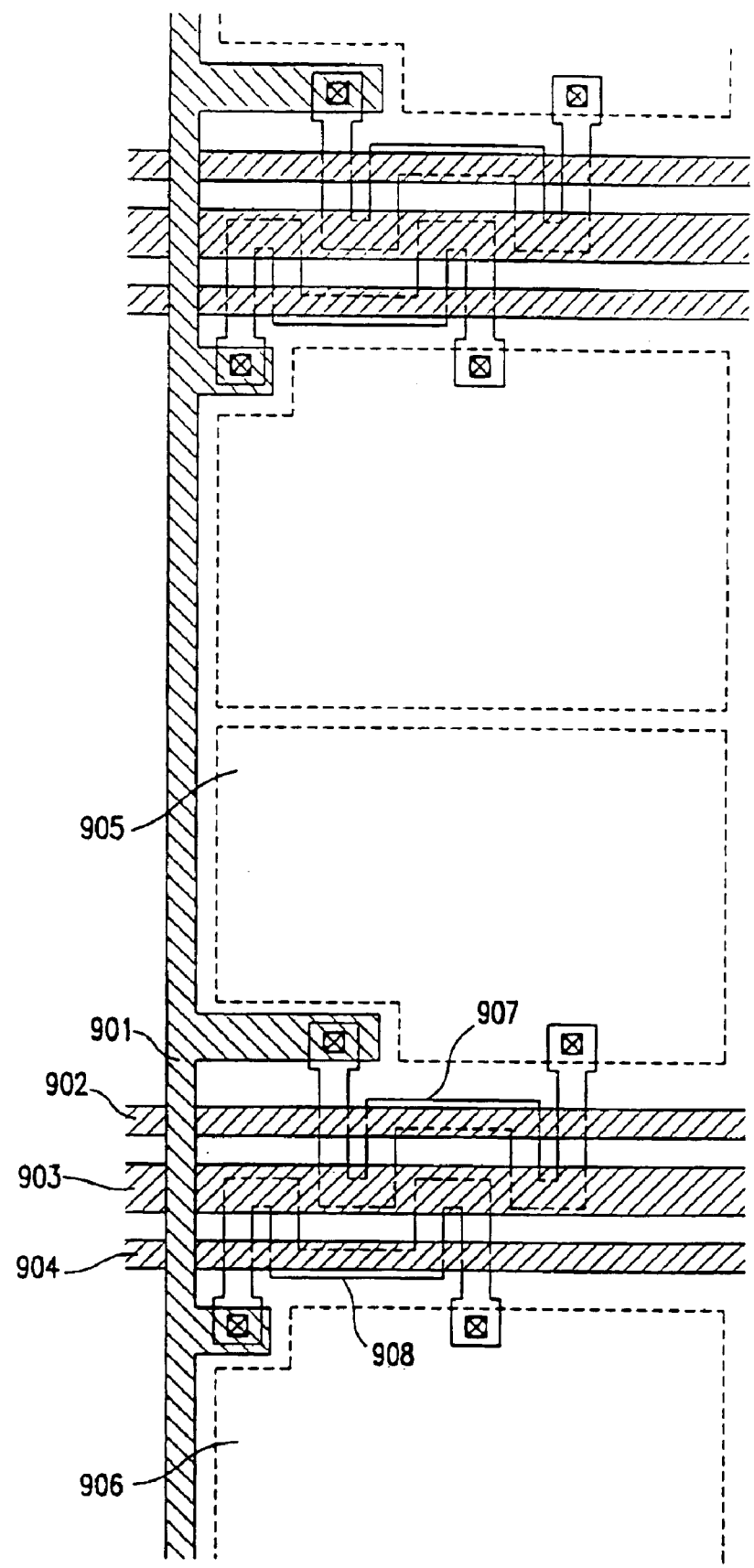
FIG. 13 is an upper view of pixel regions in Embodiment 6.

The embodiment relates to a modifying structure of the structure of FIG. 10. FIG. 13 shows a schematic structure of the embodiment. An equivalent circuit of the embodiment is shown in FIG. 10. When the structure of the embodiment is used, a high aperture ratio can be obtained.

Figure 2A:
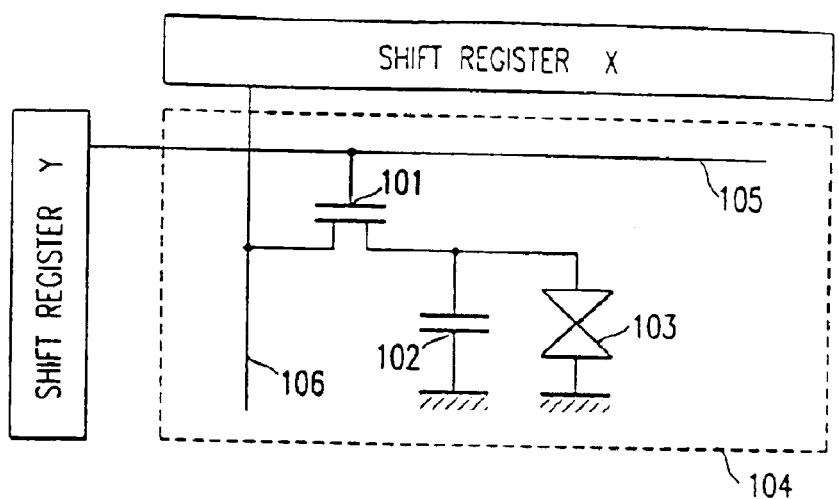
FIGS. 2A to 2D show the outline of active matrix circuits.
Figure 2B:
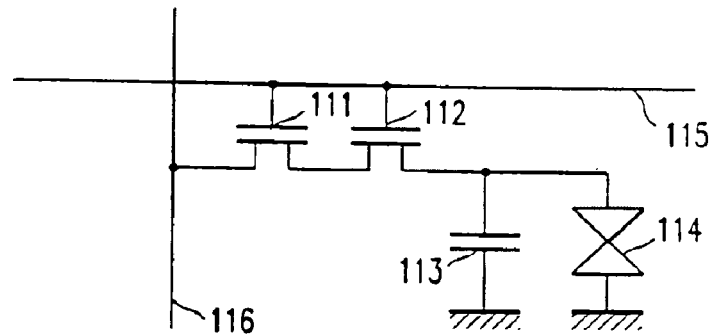
Figure 2C:
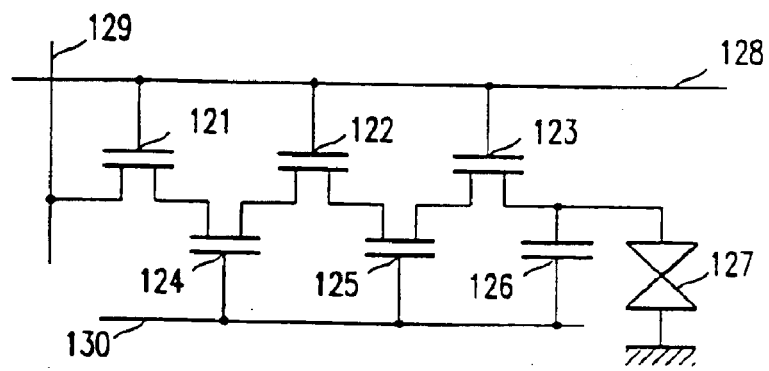
Figure 2D:
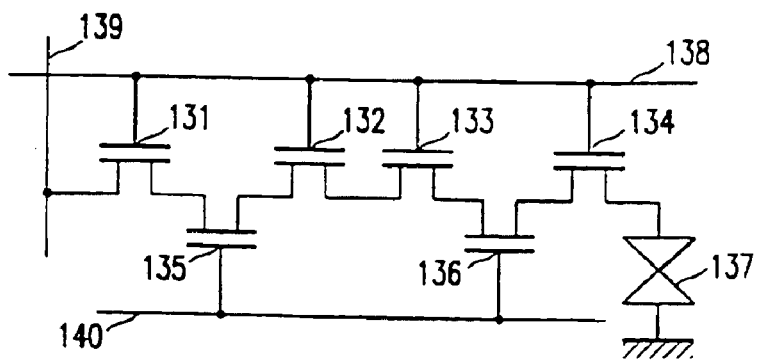

In the present invention, it is possible to suppress a drop in the voltage of the liquid crystal cell by connecting the gates of a plurality of TFTs to a gate signal line and a capacitor line. In general, deterioration of TFTs depends on the voltage between the source and the drain. However, according to the present invention, since a voltage between the source and the drain of the TFTs 122 and 123 of FIG. 2C is low during all driving processes and the TFTs 122 to 124 have an LDD region, it is possible to prevent deterioration by the present invention.

The present invention is effective in applications which require a high resolution image display. That is, to display 256 or more extremely subtle gradations of light and shade, the discharge of the liquid crystal cell must be suppressed to 1% or less during one frame. With conventional systems, neither of FIG. 2A or 2B, are suitable for this objective.

The present invention is suitable for an active matrix display device using crystalline silicon semiconductor TFTs, which is suitable for matrix displays and the like which have a particularly large number of rows (lines). In general, with a matrix having a large number of rows, the selection period per row is short and thus amorphous silicon semiconductor TFTs are not suitable. However, TFTs using crystalline silicon semiconductors have the problem that the OFF current is large. Thus the present invention in which the OFF current can be reduced can also make a significant contribution in this field. TFTs using amorphous silicon semiconductors are also advantageous.

The embodiments are described mainly with respect to TFTs having a top gate type structure, but the advantages of the present invention do not vary if a bottom gate type structure or other structure are used.

With the present invention, it is possible to obtain a maximum effect with a minimum change. In particular, with top gate type TFTs, although the form of the thin semiconductor region (active layer) is complicated, the gate electrodes and the like have an extremely simple form, and it is consequently possible to prevent cutting (disconnecting) of the upper layer wirings. Conversely, if the gate electrode has a complicated form, then this causes a reduction in the aperture ratio. Thus the present invention is beneficial in industry.

What is claimed is:

1. A display device comprising:
   a gate line over a substrate;
   an image signal line extending across the gate line over the substrate;
   a pixel electrode disposed at an intersection of the gate line and the image signal line;
   at least first, second, and third thin film transistors disposed between the image signal line and the pixel electrode,
   wherein each gate electrode of the first, second, and third thin film transistors is commonly connected to the gate line,
   wherein an impurity region of the first thin film transistor is connected to the image signal line, and an impurity region of the third thin film transistor is electrically connected to the pixel electrode, and
   wherein the second and third thin film transistors are connected in series.

2. A device according to claim 1, wherein each of the first, second, and third thin film transistors comprise one approximately M-shaped semiconductor film.

3. A display device comprising:
   a gate line over a substrate;
   an image signal line extending across the gate line over the substrate;
   a pixel electrode disposed at an intersection of the gate line and the image signal line;
   at least first, second, third, and fourth thin film transistors disposed between the image signal line and the pixel electrode,
   wherein an impurity region of the first thin film transistor is connected to the image signal line, and a gate electrode of the fourth thin film transistor is connected to a capacitance line,
   wherein the second and third thin film transistors are connected in series, and
   wherein a storage capacitor is provided between the pixel electrode and the capacitance line.

4. A device according to claim 3, wherein each of the first, second, third, and fourth thin film transistors comprise one approximately M-shaped semiconductor film.

5. A display device comprising:
   a gate line over a substrate;
   an image signal line extending across the gate line over the substrate;
   a pixel electrode disposed at an intersection of the gate line and the image signal line;
   at least first, second, and third thin film transistors disposed between the image signal line and the pixel electrode,
   wherein an impurity region of the first thin film transistor is connected to the image signal line, and an impurity region of the third thin film transistor is electrically connected to the pixel electrode,
   wherein a gate electrode of the second thin film transistor is connected to a capacitance line, and
   wherein a storage capacitor is provided between the pixel electrode and the capacitance line.

6. A device according to claim 5, wherein each of the first, second, and third thin film transistors comprise one approximately M-shaped semiconductor film.

7. A display device comprising:
   a gate line over a substrate;
   an image signal line extending across the gate line over the substrate;
   a capacitance line extending parallel to the gate line over the substrate;
   a pixel electrode disposed at an intersection of the gate line and the image signal line;
   at least first, second, third, and fourth thin film transistors disposed between the image signal line and the pixel electrode,
   wherein an impurity region of the first thin film transistor is connected to the image signal line, and an impurity region of the third thin film transistor is electrically connected to the pixel electrode,
   wherein gate electrodes of the second and fourth thin film transistors are connected to the capacitance line.

8. A device according to claim 7, wherein each of the first, second, third, fourth thin film transistors comprise one approximately M-shaped semiconductor film.

9. A display device comprising:
   a gate line over a substrate;
   an image signal line extending across the gate line over the substrate;
   a pixel electrode disposed at an intersection of the gate line and the image signal line; and
   at least first, second, and third thin film transistors disposed in series between the image signal line and the pixel electrode,
   wherein an impurity region of the first thin film transistor is connected to the image signal line, and an impurity region of the third thin film transistor is electrically connected to the pixel electrode, and
   wherein each gate electrode of the first, second, and third thin film transistors is commonly connected to the gate line.

10. A display device comprising:
    a gate line over a substrate;
    an image signal line extending across the gate line over the substrate;
    a pixel electrode disposed at an intersection of the gate line and the image signal line; and
    at least first, second, and third thin film transistors disposed in series between the image signal line and the pixel electrode,
    wherein an impurity region of the first thin film transistor is connected to the image signal line, and an impurity region of the third thin film transistor is electrically connected to the pixel electrode,
    wherein each gate electrode of the first, second, and third thin film transistors is commonly connected to the gate line, and
    wherein each channel region of the first, second, and third thin film transistors is included in a same semiconductor layer.

11. A display device comprising:
    a gate line over a substrate;
    an image signal line extending across the gate line over the substrate;

a pixel electrode disposed at an intersection of the gate line and the image signal line;

at least first, second, and third thin film transistors disposed in series between the image signal line and the pixel electrode; and a storage capacitor electrically connected to the pixel electrode, wherein an impurity region of the first thin film transistor is connected to the image signal line, and an impurity region of the third thin film transistor is electrically connected to the pixel electrode, and wherein each gate electrode of the first, second, and third thin film transistors is commonly connected to the gate line.

12. A display device according to claim 11, wherein the storage capacitor comprises the pixel electrode and a capacitance line.

13. A display device comprising:

a gate line over a substrate;

an image signal line extending across the gate line over the substrate;

a pixel electrode disposed at an intersection of the gate line and the image signal line;

at least first, second, and third thin film transistors disposed in series between the image signal line and the pixel electrode; and a storage capacitor electrically connected to the pixel electrode, wherein an impurity region of the first thin film transistor is connected to the image signal line, and an impurity region of the third thin film transistor is electrically connected to the pixel electrode, wherein each gate electrode of the first, second, and third thin film transistors is commonly connected to the gate line, and wherein each channel region of the first, second, and third thin film transistors is included in a same semiconductor layer.

14. A display device according to claim 13, wherein the storage capacitor comprises the pixel electrode and a capacitance line.

* * * * *